US011227747B2

(12) United States Patent
Lin et al.

(10) Patent No.: US 11,227,747 B2
(45) Date of Patent: Jan. 18, 2022

(54) ETCH PROCESS WITH ROTATABLE SHOWER HEAD

(71) Applicant: TAIWAN SEMICONDUCTOR MANUFACTURING CO., LTD., Hsinchu (TW)

(72) Inventors: Yu-Chi Lin, Hsinchu (TW); Yi-Wei Chiu, Kaohsiung (TW); Hung-Jui Chang, Changhua (TW); Chin-Hsing Lin, Chiayi (TW); Yu Lun Ke, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 78 days.

(21) Appl. No.: 16/657,503

(22) Filed: Oct. 18, 2019

(65) Prior Publication Data

US 2020/0051791 A1    Feb. 13, 2020

Related U.S. Application Data

(62) Division of application No. 16/038,825, filed on Jul. 18, 2018, now Pat. No. 10,529,543.
(Continued)

(51) Int. Cl.
*H01J 37/32* (2006.01)
*H01L 21/683* (2006.01)
(Continued)

(52) U.S. Cl.
CPC .. *H01J 37/32449* (2013.01); *H01J 37/32128* (2013.01); *H01J 37/32174* (2013.01);
(Continued)

(58) Field of Classification Search
CPC .......... H01J 37/32449; H01J 21/31116; H01J 21/6833; H01J 21/3065; H01J 37/32128;
(Continued)

(56) References Cited

U.S. PATENT DOCUMENTS

| 4,134,425 A | * | 1/1979 | Gussefeld | .............. | B01J 8/0278 |
| | | | | | 137/625.3 |
| 4,464,223 A | * | 8/1984 | Gorin | ........................ | C23F 4/00 |
| | | | | | 156/345.45 |

(Continued)

FOREIGN PATENT DOCUMENTS

| CN | 101615572 A | 12/2009 |
| CN | 102424955 A | 4/2012 |

(Continued)

*Primary Examiner* — Rudy Zervigon
(74) *Attorney, Agent, or Firm* — Sterne, Kessler, Goldstein & Fox P.L.L.C.

(57) ABSTRACT

The present disclosure describes an exemplary etch process in a reactor that includes a shower head and an electrostatic chuck configured to receive a radio frequency (RF) power. The shower head includes a top plate and a bottom plate with one or more gas channels that receive incoming gases. The method can include (i) rotating the top plate or the bottom plate of the shower head to a first position to allow a gas to flow through the shower head; (ii) performing a surface modification cycle that includes: applying a negative direct current (DC) bias voltage to the shower head, applying an RF power signal to the wafer chuck; and (iii) performing an etching cycle that includes: removing the negative DC bias voltage from the shower head and lowering the RF power signal applied to the wafer chuck.

20 Claims, 8 Drawing Sheets

Related U.S. Application Data

(60) Provisional application No. 62/586,327, filed on Nov. 15, 2017.

(51) Int. Cl.
*H01L 21/3065* (2006.01)
*H01L 21/311* (2006.01)

(52) U.S. Cl.
CPC .... *H01J 37/32715* (2013.01); *H01L 21/3065* (2013.01); *H01L 21/31116* (2013.01); *H01L 21/6833* (2013.01); *H01J 2237/327* (2013.01); *H01J 2237/3341* (2013.01); *H01L 21/6831* (2013.01)

(58) Field of Classification Search
CPC ........... H01J 37/32715; H01J 37/32174; H01J 21/6831; H01J 2237/327; H01J 2237/3341
USPC ..... 118/723 E, 723 ER; 156/345.43, 345.44, 156/345.45, 345.46, 345.47
See application file for complete search history.

(56) References Cited

U.S. PATENT DOCUMENTS

| | | | | |
|---|---|---|---|---|
| 6,101,969 | A * | 8/2000 | Niori | H01J 37/32559 118/723 E |
| 6,132,805 | A * | 10/2000 | Moslehi | C23C 14/22 118/720 |
| 6,162,323 | A * | 12/2000 | Koshimizu | H01J 37/3244 156/345.26 |
| 6,197,246 | B1 * | 3/2001 | Niori | H01J 37/32009 118/723 E |
| 7,883,601 | B2 * | 2/2011 | Chang | H01J 37/32623 156/345.48 |
| 8,092,598 | B2 * | 1/2012 | Baek | C23C 16/45551 118/715 |
| 8,221,582 | B2 | 7/2012 | Patrick et al. | |
| 8,291,857 | B2 * | 10/2012 | Lam | C23C 16/4558 118/723 ME |
| 9,305,770 | B2 | 4/2016 | Kinoshita et al. | |
| 10,062,585 | B2 * | 8/2018 | Lubomirsky | H01J 37/32009 |
| 10,403,535 | B2 * | 9/2019 | Ye | H01L 21/6833 |
| 10,504,727 | B2 * | 12/2019 | Wang | C23C 16/06 |
| 10,529,543 | B2 * | 1/2020 | Lin | H01J 37/32449 |
| 10,533,252 | B2 * | 1/2020 | Chiu | H01J 37/3244 |
| 10,784,118 | B2 | 9/2020 | Fischer et al. | |
| 2003/0010452 | A1 * | 1/2003 | Park | C23C 16/45565 156/345.33 |
| 2003/0033979 | A1 * | 2/2003 | Kholodenko | C23C 16/455 118/715 |
| 2004/0082251 | A1 * | 4/2004 | Bach | C23C 16/52 445/60 |
| 2005/0145338 | A1 * | 7/2005 | Park | C23C 16/45589 156/345.34 |
| 2005/0258280 | A1 | 11/2005 | Goto et al. | |
| 2006/0102286 | A1 * | 5/2006 | Kim | C23C 16/507 156/345.35 |
| 2007/0163716 | A1 * | 7/2007 | Hsiao | H01J 37/32449 156/345.26 |
| 2009/0317981 | A1 | 12/2009 | Lee et al. | |
| 2012/0108072 | A1 * | 5/2012 | Angelov | C23C 16/45565 438/712 |
| 2013/0098293 | A1 * | 4/2013 | Lee | C23C 16/45578 118/728 |
| 2013/0107415 | A1 * | 5/2013 | Banna | H01L 21/6831 361/234 |
| 2014/0272211 | A1 * | 9/2014 | Nguyen | H01J 37/32477 428/34.1 |
| 2015/0011095 | A1 * | 1/2015 | Chandrasekharan | C23C 16/45523 438/758 |
| 2015/0083582 | A1 * | 3/2015 | Dhindsa | H01J 37/32422 204/192.37 |
| 2016/0260587 | A1 | 9/2016 | Miura | |
| 2017/0283948 | A1 * | 10/2017 | Chiu | H01J 37/32357 |
| 2018/0096865 | A1 * | 4/2018 | Lubomirsky | H01L 21/67069 |
| 2018/0366351 | A1 * | 12/2018 | Lubomirsky | H01J 37/3244 |
| 2019/0019670 | A1 * | 1/2019 | Lin | H01L 21/67017 |
| 2019/0148116 | A1 * | 5/2019 | Lin | H01J 37/32449 216/67 |

FOREIGN PATENT DOCUMENTS

| | | |
|---|---|---|
| CN | 107146755 A | 9/2017 |
| TW | 200539348 A | 12/2005 |
| TW | 200612486 A | 4/2006 |
| TW | 201016079 A | 4/2010 |
| TW | 201409560 A | 3/2014 |
| TW | 201726271 A | 8/2017 |

\* cited by examiner

ETCH PROCESS WITH ROTATABLE SHOWER HEAD

CROSS-REFERENCE TO RELATED APPLICATION

This application is a divisional of U.S. Non-Provisional Patent Application No. 16/038,825, filed on Jul. 18, 2018 and titled "Etch Process with Rotatable Shower Head," which claims the benefit of U.S. Provisional Patent Application No. 62/586,327, filed on Nov. 15, 2017 and titled "Etch Process with Rotatable Shower Head." The entire contents of both applications are incorporated by reference herein in their entireties.

BACKGROUND

Dry etching is a frequently used process in semiconductor manufacturing. Before etching, a wafer is coated with photoresist or a hard mask (e.g., oxide or nitride) and exposed to a circuit pattern during a photolithography operation. Etching removes material from the pattern traces. This sequence of patterning and etching can be repeated multiple times during chip manufacturing.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
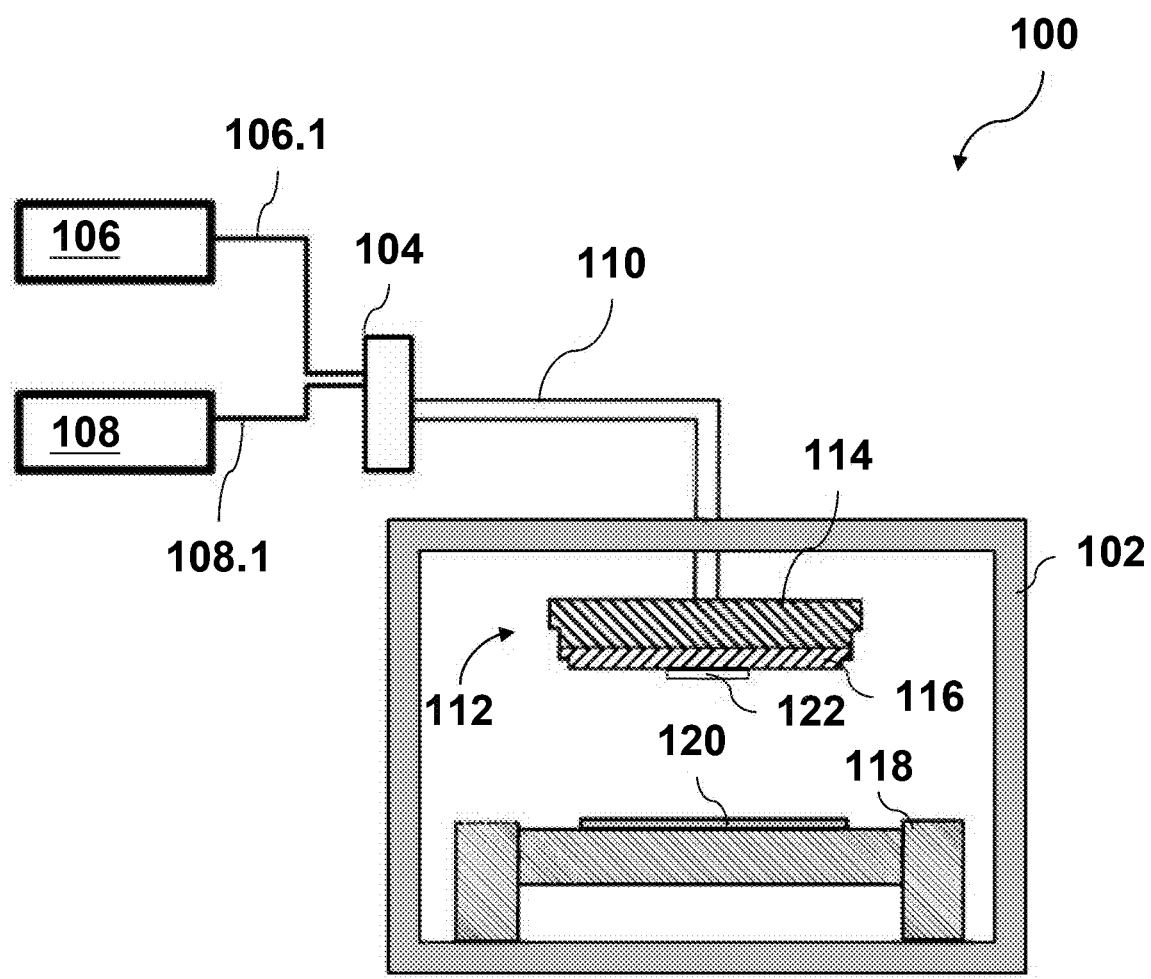
FIG. 1 is a cross-sectional view of an exemplary atomic layer etch (ALE) system, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances. Unless defined otherwise, technical and scientific terms used herein have the same meanings as commonly understood by one of ordinary skill in the art to which this disclosure belongs.

The term "about" as used herein indicates the value of a given quantity varies by ±10% of the value, or optionally ±5% of the value, or in some embodiments, by ±1% of the value so described. For example, "about 100 nm" encompasses a range from 90 nm to 110 nm, inclusive.

Dry etching is a frequently used process in semiconductor manufacturing. Before etching, a wafer is coated with a photoresist or a hard mask (e.g., oxide or nitride) and a circuit pattern is transferred on the photoresist or the hard mask using photolithographic processes (e.g., photo exposure, post exposure bake, develop, hard bake, etc.). Etching is subsequently used to remove material from the surface of the wafer that is not covered by the patterned photoresist or hard mask. This sequence of patterning and etching can be repeated multiple times during chip manufacturing.

Plasma etching is performed by applying electromagnetic energy (e.g., radio frequency (RF)) to a gas that contains a chemically reactive element, such as fluorine or chlorine, to form a plasma. The plasma releases positively charged ions that can bombard the surface of a wafer to remove, or etch, material. At the same time, chemically reactive free radicals (e.g., atoms or groups of atoms with unpaired electrons) can react with the etched material to form volatile or nonvolatile byproducts. The electric charge of the ions can direct them vertically toward the wafer when the wafer is appropriately biased (e.g., when the wafer is biased opposite to the electric charge of the ions). To improve etch throughput, high etch rates (e.g., several Å/min or nm/min) are desirable.

Process chemistries can differ depending on the types of films to be etched. For example, etch chemistries used in dielectric etch applications can be fluorine-based. Silicon and metal etch applications can use chlorine-based chemistries. An etch step may include etching one or more film layers from the surface of a wafer. When multiple layers are being etched, for example during the formation of contact openings, and the etch process is required to stop on a particular layer, the selectivity of the etch process becomes an important parameter. Selectivity of an etch chemistry or an etch process can be defined as the ratio of two etch rates: the rate for the layer to be removed and the rate for the layer to be protected (e.g., that of a mask or a stop layer). In a multilayer etch process, high selectivity values (e.g., greater than 10:1) are desirable.

In an ideal case, the etch rate of an etch chemistry is the same (uniform) at all points/locations on a wafer, or within a die on a wafer. For example, in such an ideal case, the etch chemistry can etch the same structure (e.g., form a contact opening) across the wafer the same way, or etch different structures (e.g. form one or more contact openings), within a die the same way. The degree to which the etch rate of an etch chemistry varies at different points/locations on the wafer, or within a die on a wafer, is known as non-uniformity or micro-loading. Minimizing the micro-loading is an objective in an etch process.

For example, micro-loading may occur when etched features (e.g., contact openings), or etched structures, have different dimensions (e.g., top critical dimension (CD) and/or depth) and same density (e.g., pitch, or spacing, between adjacent structures), or same dimensions and different density. Micro-loading can be challenging in chip manufacturing because within a die or across a wafer, features or structures with different dimensions and densities can concurrently be present.

The embodiments described herein are directed to an exemplary atomic layer etch (ALE) process that can reduce etch micro-loading effects during the formation of contact openings in one or more dielectric layers. According to some embodiments, the ALE process can control the ion/radical ratio during each reaction cycle. In some embodiments, the ALE process may use a multi-channel, rotating gas plate to reduce the transition time between reaction cycles. According some embodiments, the ALE process can use electrostatic forces between a target and a wafer to reduce the "switching time" between reaction cycles.

Atomic layer etching, or ALE, is a technique that can remove thin layers of material from the surface of a wafer using sequential reaction cycles (e.g., duty cycles); for example, during the formation of contact openings in one or more dielectric layers. The sequential reaction cycles of an ATE process can be "quasi self-limiting." In some embodiments, quasi self-limiting reactions may refer to those reactions that slow down as a function of time (e.g., asymptotically), or as a function of species dosage. An ALE implementation can include two sequential reaction cycles: (i) surface modification cycle (reaction A), and (ii) material removal cycle (reaction B). The surface modification cycle can form a reactive surface layer with a defined thickness from a material on the surface of a wafer that has been exposed to the surface modification process. The modified material layer (reactive surface layer) can be subsequently removed during the next cycle (e.g., removal cycle). Any unmodified material, which is not exposed to the surface modification chemistry during the surface modification cycle, will not be removed. The modified material, for example, can have a gradient in chemical composition and/or physical structure. The material removal cycle removes the modified material layer while keeping the unmodified material(s) or layers intact, thus "resetting" the surface to a near-pristine state for the next etching cycle. The total amount of material removed can be controlled by the number of repeated cycles (e.g., surface modification cycle and material removal cycle).

The ALE technique can be used in a variety of etching schemes including, but not limited to, directional or isotropic etching (e.g., formation of contact openings) and selective or nonselective etching (e.g., removal of layers from an exposed surface). In an ALE process the reactants can be, for example, delivered by one or more gases, a plasma, or other sources.

In some embodiments, a time elapsed between sequential cycles (e.g., between the surface modification cycle and the material removal cycle) is referred to as a "transition time." During the transition time, reactants/byproducts from a current cycle are removed away from the surface of the wafer, prior to the release of new reactants. Prompt delivery of reactants in the reactor can reduce the transition time between cycles and the cycle duration (cycle time). In some embodiments, gases can be delivered to an ALE reactor through a multi-channel, rotating gas plate that can reduce the delivery time of reactants in the ALE reactor.

FIG. 1 is a cross-sectional view of an exemplary ALE system 100, according to some embodiments. By way of example and not limitation, ALE system 100 can include an exemplary ALE reactor 102, a gas switch box 104, and gas boxes 106 and 108. In some embodiments, gas switch box 104 can be a gas distribution system where gas valves and gas lines (not shown in FIG. 1) are housed. The gases from gas boxes 106 and 108 are delivered to gas switch box 104 via gas lines 106.1 and 108.1, respectively. The gases from gas switch box 104 can be delivered to ALE reactor 102 via gas delivery line 110. In some embodiments, ALE system 100 may not be limited to two gas boxes, and additional gas boxes can be possible. Additionally, more than one gas delivery lines 110 may be possible.

According to some embodiments, ALE reactor 102 includes a shower head 112. According to some embodiments, shower head 112 includes a top plate 114 and a bottom plate 116. According to some embodiments, bottom plate 116 can rotate clockwise or counter clockwise around an axis perpendicular to its center of mass with the help of a stepping motor or another suitable mechanism. In some embodiments, top plate 114 can rotate clockwise or counter clockwise around an axis perpendicular to its center of mass with the help of a stepping motor or another suitable mechanism. In some embodiments both top and bottom plates 114 and 116 can rotate independently from one another. By way of example and not limitation, top and bottom gas plates 114 and 116 can include "gas channels" (e.g., cavities where a gas can flow through), where one or more gases can be delivered from gas switch box 104 through gas delivery line 110. In some embodiments, shower head 112 can be electrically connected to an external power supply (not shown in FIG. 1), such as a radio frequency (RF) generator or a direct current (DC) power supply that may keep shower head 112 at a negative bias voltage. In some embodiments, the RF power signal applied to shower head 112 can range from about 0 to about 2000 Watts (e.g., 50 Watts to 400 Watt, 100 Watts to 600 Watts, or 1000 Watts to 2000 Watts), and the negative DC bias voltage can range from 0 to about 900 Volts (e.g., 450 Volts to 500 Volts).

ALE reactor 102 can also include a wafer chuck 118. In some embodiments, wafer chuck 118 is an electrostatic chuck that can be electrically connected to an external power supply (not shown in FIG. 1)—such as a RF generator—and apply an RF signal to wafer 120.

In some embodiments, ALE system 100 may include additional components. These additional components may not be depicted in FIG. 1. These components, however, are within the spirit and scope of this disclosure. By way of example and not limitation, such components may include exhaust lines, additional reactors, wafer transfer modules, cooling systems, heaters, laser detectors, robotic arms, valve controllers, slot valves, pedestals, deposition shields, deposition rings, mass flow controllers, additional gas lines, power generators, internal and external electrical connections to electronic modules (e.g., computers, electrical signal feedback loops, motors, etc.), pumps stacks, temperature and pressure sensors, etc. In some embodiments, ALE system 100 can be attached to a cluster tool or it can be a stand-alone unit.

Figure 2:
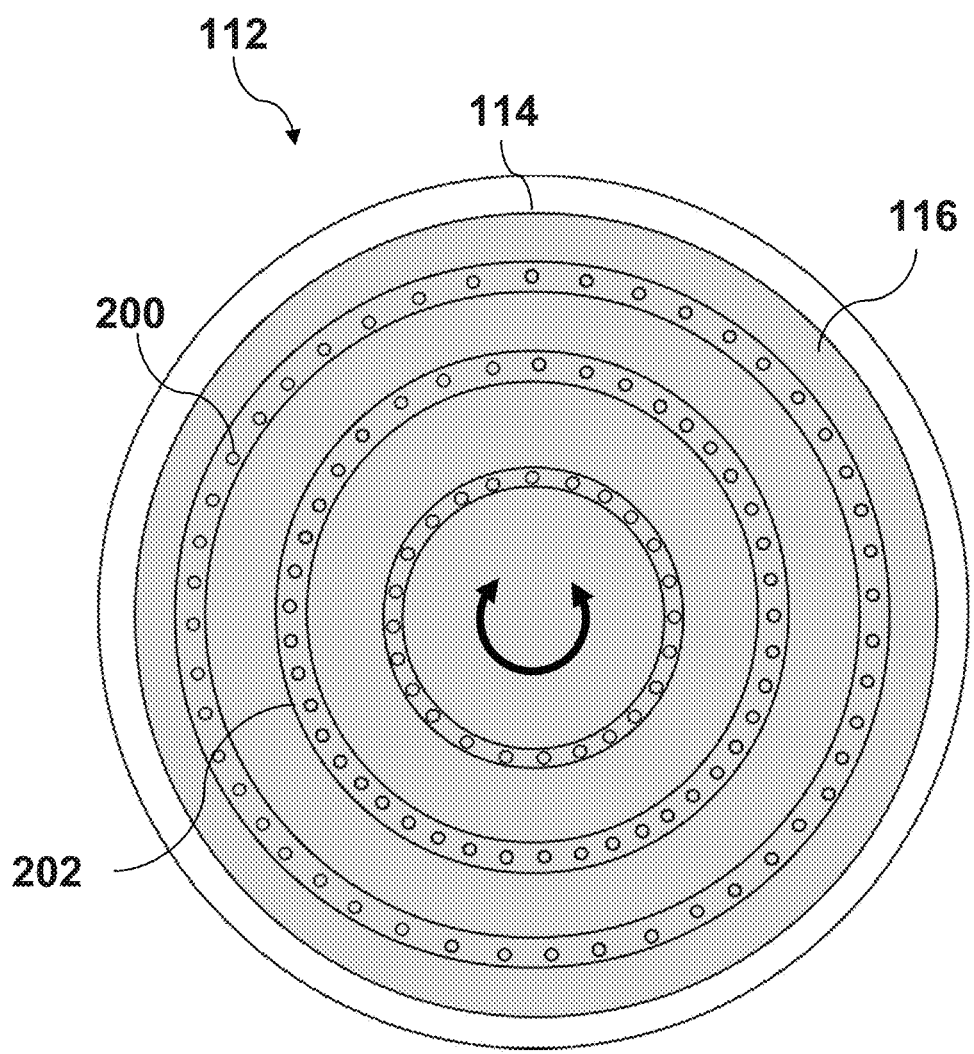
FIG. 2 is a bottom view of a shower head of an atomic layer etch (ALE), according to some embodiments.

FIG. 2 is a bottom view of exemplary shower head 112, according to some embodiments. By way of example and not limitation, bottom plate 116 of shower head 112 has one or more openings 200 arranged in one or more concentric circles 202. The number of openings 200 and their arrangement over the surface of bottom plate 116 is not limited to the example of FIG. 2. Based on the disclosure herein, fewer or additional openings 200 in different arrangements can be used. Different number of openings 200 and their respective arrangements on the surface of bottom plate 116 are, therefore, within the spirit and scope of this disclosure. According to some embodiments, openings 200 can be about 0.1 mm in diameter. However, smaller or larger openings 200 are possible.

In some embodiments, bottom plate 116 can rotate clockwise or counter clockwise around its axis to release one or more gases through openings 200. According to some embodiments, top plate 114 and bottom plate 116 can feature a plurality of gas channels, where incoming gases can flow. In some embodiments, a gas can be released into ALE reactor 102 through openings 200 when, for example, the rotation of bottom plate 116 allows corresponding gas channels from both plates (e.g., top plate 114 and bottom plate 116) to align. In other words, when gas channel alignment occurs between the top and bottom plates (e.g., 114 and 116 respectively), a path is created and the gas can be released through openings 200 into ALE reactor 102. Depending on the rotation direction (e.g., clockwise or counter clockwise), the channels on the top and bottom plates 114 and 116 can be aligned or misaligned, and therefore, a gas can be released or restricted from flowing into ALE reactor 102.

Figure 3:
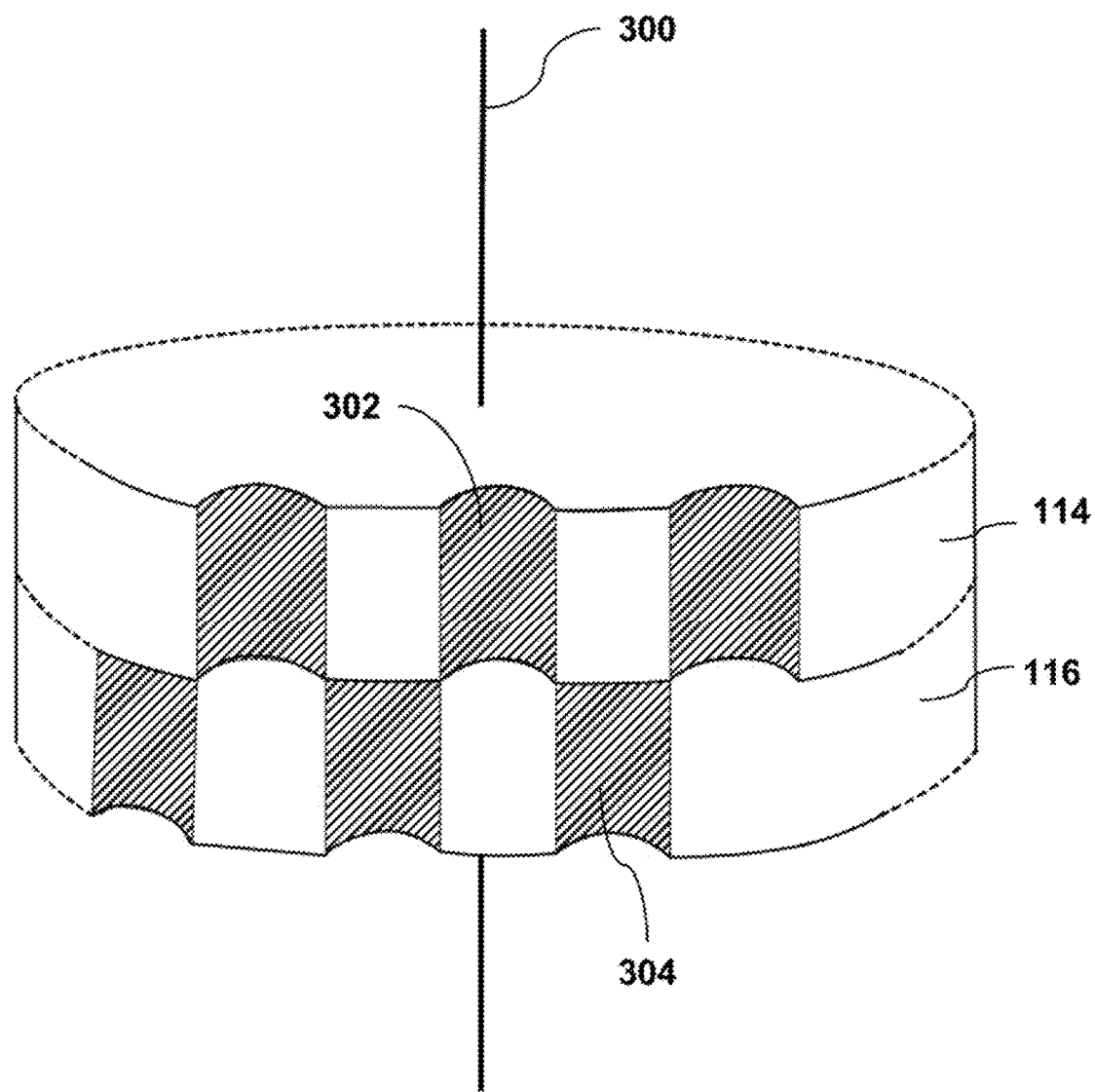
FIG. 3 is a cross-sectional view of a portion of a shower head having a gas channel in a top plate misaligned with a gas channel in a bottom plate, according to some embodiments.
Figure 4:
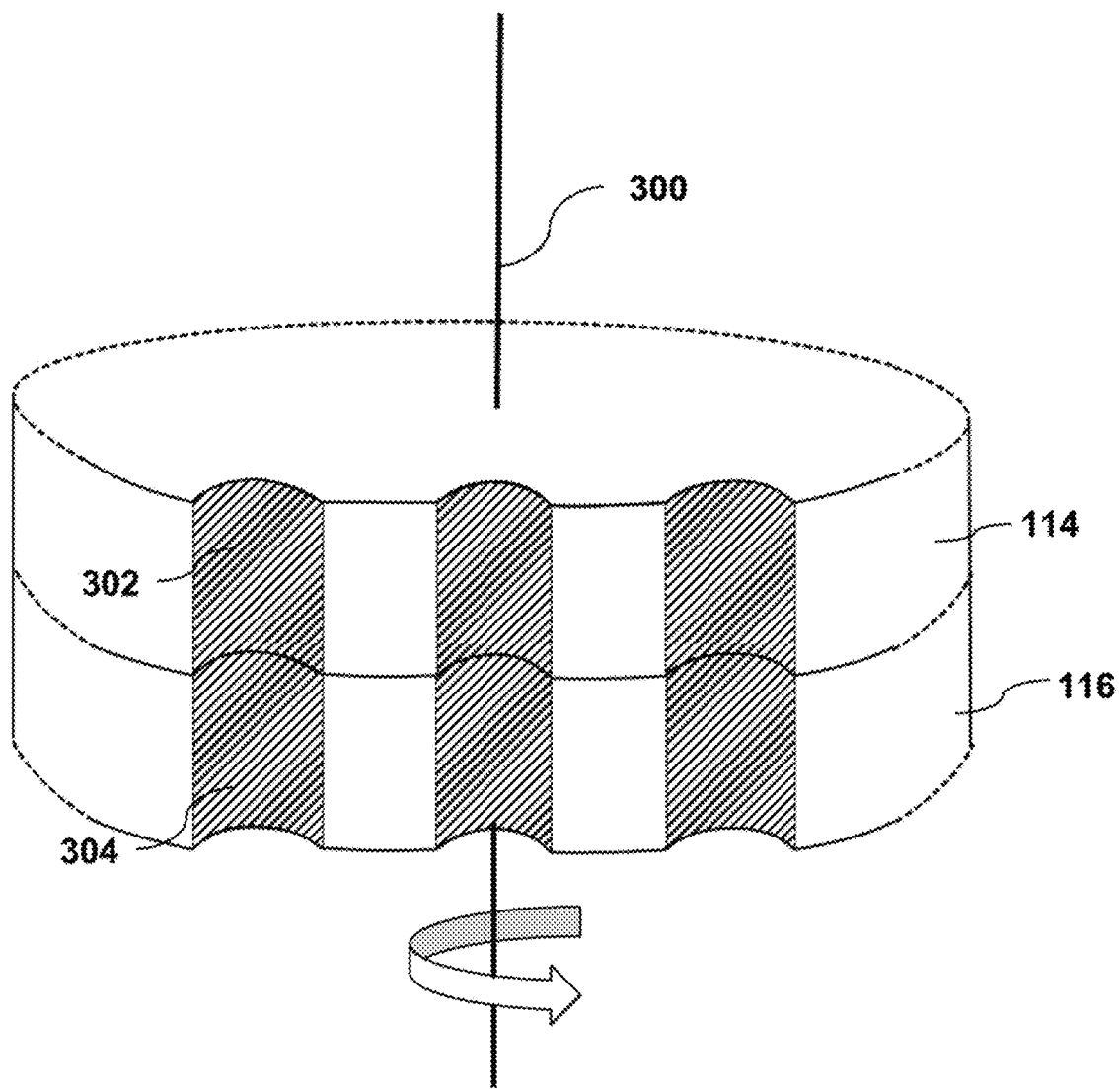
FIG. 4 is a cross-sectional view of a portion of a shower head having a gas channel in a top plate aligned with a gas channel in a bottom plate, according to some embodiments.

FIGS. 3 and 4, which are a cross-sectional views of a portion of top plate 114 and bottom plate 116, can be used to describe the principle behind the operation of shower head 112. For example purposes, operation of shower head 112 will be described in the context of a rotating bottom plate 116 and a fixed top plate 114.

According to some embodiments, bottom plate 116 of shower head 112 can rotate clockwise or counter clockwise around a rotation axis 300 relative to the fixed top plate 114. By way of example and not limitation, rotation axis 300 can traverse the center of concentric circles 202 of bottom plate 116 of FIG. 2. As discussed above, top plate 114 and bottom plate 116 may include multiple gas channels. For example, referring to FIG. 3, top plate 114 can have an exemplary gas channel 302, and bottom plate 116 can have an exemplary gas channel 304. In some embodiments, gas channel 304 of bottom plate 116 can lead to a single opening 200 that can be disposed in one of the concentric circles 202. In FIG. 3, gas channels 302 and 304 are misaligned. Therefore, a gas entering ALE reactor 102 through gas delivery line 110, can flow into gas channel 302 of top plate 114 but is not permitted to flow further, for example, into gas channel 304 of bottom plate 116. According to some embodiments, FIG. 3 describes a starting closed position of bottom plate 116.

Once a gas has filled gas channels 302 of top plate 114, bottom plate 116 can rotate around rotation axis 300 so that gas channels 302 and 304 are aligned—e.g., an open position. In FIG. 4, bottom plate 116 has been rotated counter clockwise around rotation axis 300 so that gas channels 302 and 304 are aligned. In some embodiments, once gas channels 302 and 304 have been aligned, the gas is allowed to flow through gas channel 304 and openings 200 into ALE reactor 102. In some embodiments, partially aligned gas channels 302 and 304 can also allow the gas to flow through. The gas is permitted to flow into ALE reactor 102 until bottom plate 116 can rotate clockwise into its starting closed position shown in FIG. 3, where gas channels 304 and 302 are misaligned. The aforementioned process can be synchronized with one or more cycles of an ALE process to control the gas dosage for each ALE cycle. In some embodiments, bottom plate 116 can rotate from the starting closed position to the final open position, and the other way around, within 100 ms.

In some embodiments, bottom plate 116 operates as a gas flow actuator in shower head 112. A benefit of the bottom plate rotation, as opposed to an external gas valve that "opens" and "closes" to provide and restrict gas flow, is that the time between gas release, cycle process, and gas evacuation (e.g., pump down) can be reduced. In some embodiments, the gas release time in ALE reactor 102 can be reduced from 1.7 s to 0.3 s, and the time for a gas evacuation (pump down) from ALE reactor 102 can be reduced from 1.7 s to 0.2 s. This can be explained by the following example as follows. Assuming that a hypothetical external gas valve is used to allow a gas to flow into ALE reactor 102 through a shower head, the gas before entering the reactor will have to travel a portion of the gas delivery line 110 (e.g., depending on the position of the external valve on delivery line 110) and the length of the path within the shower head. Further, when one ALE cycle is over and before the new cycle begins the gas is evacuated (pumped down) from the reactor. The amount of gas removed during the pump down includes the volume of the gas in the reactor and the volume of the gas trapped between the openings in the shower head and the location of the hypothetical gas valve on delivery line 110. In contrast, based on embodiments of the present disclosure, the rotation of bottom plate 116 (e.g., in the open position) allows the gas to be instantaneously released directly from the bottom plate 116 of shower head 112 into ALE reactor 102. Similarly, when bottom plate 116 rotates to the closed position, the gas stops to flow directly from shower head 112 into the reactor. Hence, the volume of gas that is required to be removed during the pump down sequence includes only the gas in ALE reactor 102.

Figure 5:
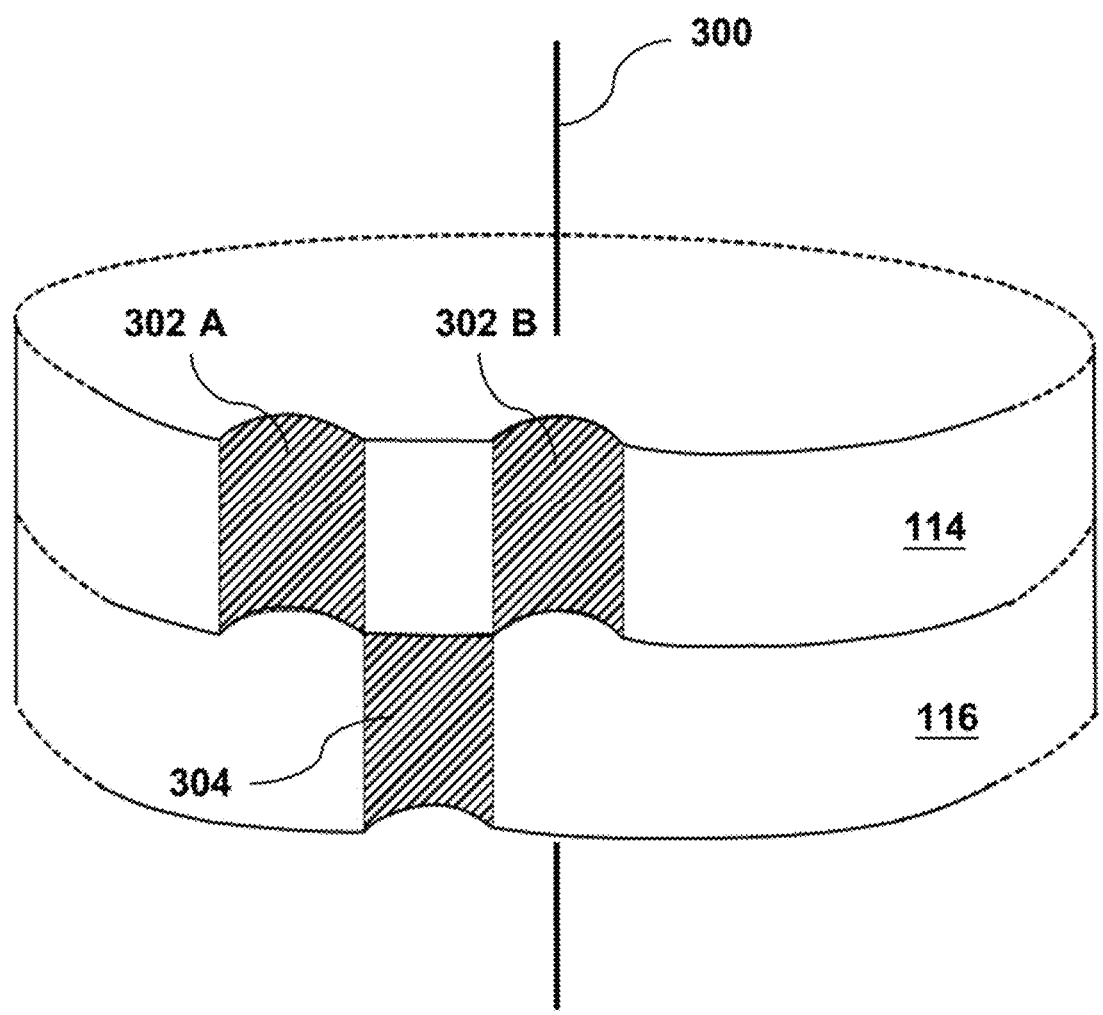
FIG. 5 is a cross-sectional view of a portion of a shower head having two gas channels on a top plate misaligned with a gas channel in a bottom plate, according to some embodiments.

In some embodiments, the design of shower head 112 can be further enhanced to support more than one gas. For example, top plate 114 can feature subsets of gas channels 302 that can receive different gases. The rotation of bottom plate 116 can be adjusted so that a subset of gas channels 302 and gas channels 304 are aligned at a time, according to some embodiments. Therefore, a predetermined selection of one or more gases can be released at a time. For example, FIG. 5 shows such an exemplary configuration, where gas channel 302 A contains gas A, and gas channel 302 B contains gas B. By way of example and not limitation, gas channel 302 A can be initially filled with a gas A from gas box 106 shown in FIG. 1, and gas channel 302 B can be initially filled with a gas B from gas box 108 shown in FIG. 1. Gases A and B can be delivered to top plate 114 through gas switch box 104 and delivery line 110 shown in FIG. 1. In the current position of bottom plate 116, none of the gases (e.g., gas A or gas B) is allowed to flow into ALE reactor 102 (closed position of bottom plate 116). If bottom plate 116 rotates counter clockwise (viewed from the top plate 114), gas B from channel 302 B is released through gas channel 304 into ALE reactor 102. On the other hand, if bottom plate 116 rotates clockwise, gas A in gas channel 302 A is released through gas channel 304 into ALE reactor 102. After each gas release, bottom plate 116 can rotate back to the closed position of FIG. 5 so that the gas flow to ALE reactor 102 is terminated, and the gas previously flown can be subsequently pumped out of ALE reactor 102. By way of example and not limitation, gas A can be a "reaction" gas that may modify a layer of a material on the surface of a wafer, and gas B can be an etchant that can remove the modified material layer.

Figure 6:
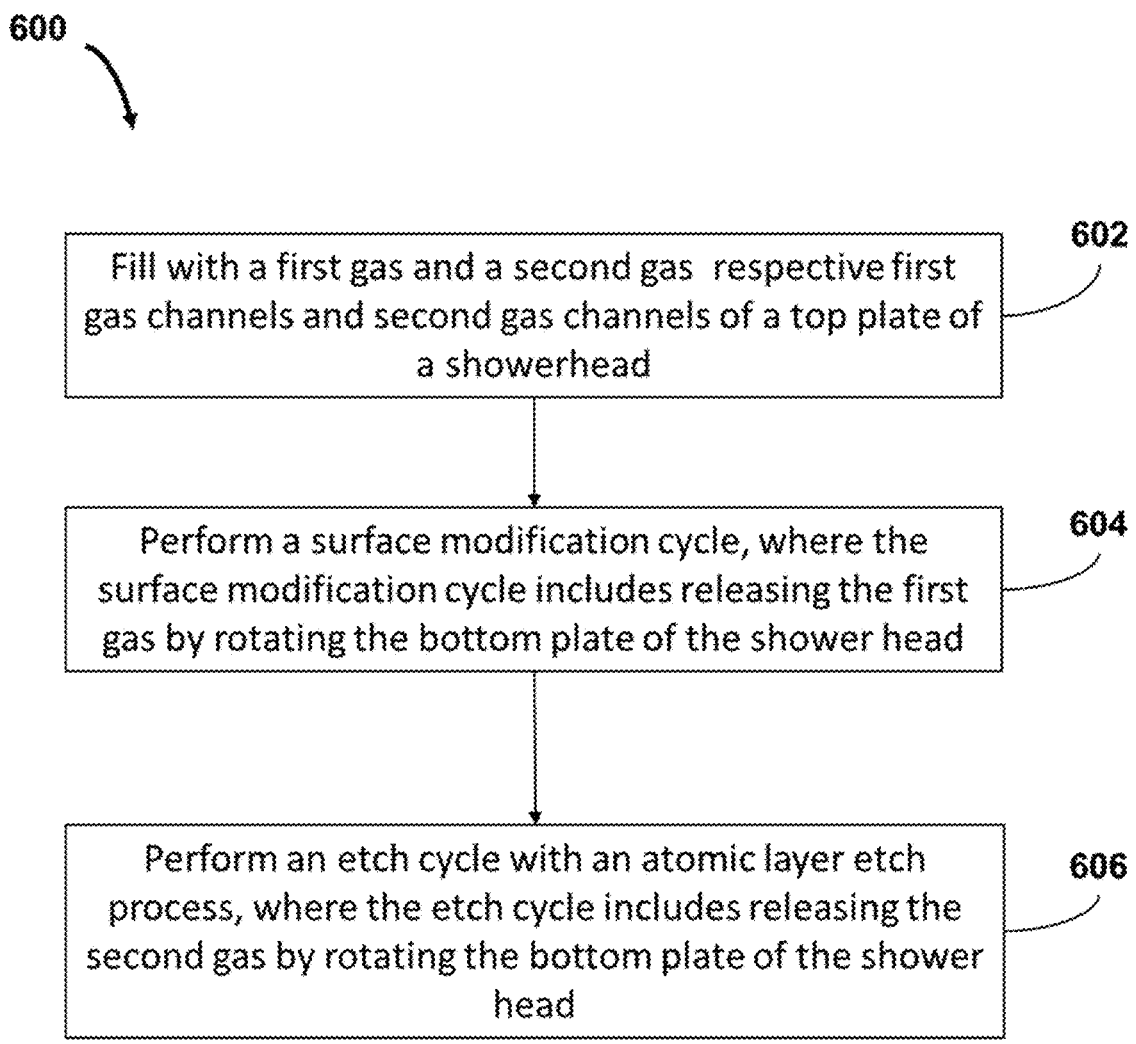
FIGS. 6 and 7 are flowcharts for exemplary atomic layer etches (ALE) in an ALE reactor, according to some embodiments.

FIG. 6 is a flowchart for an exemplary method 600 that describes an etching process using a reactor having a shower head with a top plate and a bottom plate. Other operations may be performed between the various operations of exemplary method 600 and may be omitted merely for clarity. Therefore, method 600 may not be limited to the operations described below.

Method 600 may be performed in ALE reactor 102 of ALE system 100 shown in FIG. 1. In referring to FIGS. 1-3, shower head 112 of ALE reactor 102 includes top plate 114 and bottom plate 116. Further, bottom plate 116 is configured to rotate on rotation axis 300 and can include one or more gas channels 304, according to some embodiments. As discussed above, bottom plate 116 has one or more openings 200 arranged in one or more concentric circles 202. The number of openings 200 and their arrangement over the surface of bottom plate 116 is not limited to the example of FIG. 2. Based on the disclosure herein, fewer or additional openings 200 in different arrangements can be used. Different number of openings 200 and their respective arrangements on the surface of bottom plate 116 are, therefore, within the spirit and scope of this disclosure. According to some embodiments, openings 200 can be about 0.1 mm in diameter. However, smaller or larger openings 200 are possible.

Method 600 begins with operation 602, where a first gas and a second gas fill first and second gas channels, respectively, of top plate 114. For example, in FIG. 5, gas A (first gas) can fill one or more first gas channels 302 A, and gas B (second gas) can fill one or more second gas channels 302 B. By way of example and not limitation, gas channel 302 A can be initially filled with a gas A from gas box 106 shown in FIG. 1, and gas channel 302 B can be initially filled with a gas B from gas box 108. Gases A and B can be delivered to top plate 114 through gas switch box 104 and delivery line 110 shown in FIG. 1. In some embodiments, operation 602 of method 600 may be referred to as a "preparation step" and can have a duration of, for example, about 1.7 s.

In operation 604 and referring to FIG. 5, a surface modification cycle is performed, where the surface modification cycle includes releasing the first gas (e.g., gas A) by rotating, for example clockwise, bottom plate 116 of shower head 112 to align the one or more first gas channels 302 A of top plate 114 with one or more gas channels 304 of the bottom plate 116. In some embodiments, surface modification refers to a process where the released gas (e.g., first gas A) interacts with the exposed materials on the surface of wafer 120 and forms a reactive surface layer or modified material layer with a defined thickness. The modified material layer can be subsequently removed during the removal, or etch, cycle. Any unmodified material, which is not exposed to first gas A during the surface modification cycle, will not be removed. The modified material can include a gradient in chemical composition and/or physical structure. In some embodiments, the surface modification cycle can have a duration from about 0.3 s to about 2 s. According to some embodiments, during the first 0.1 s to 0.3 s of the 2 s surface modification cycle, the flow of first gas A can be ramped up. For example, the flow of gas A can increase from zero to a target value. However, the surface modification cycle can be shorter or longer, and may depend on the reactor's geometry (e.g., reactor's volume, the distance of shower head 112 from wafer 120, etc.), the pumping speed of the pump stack (not shown in FIG. 1), or other process parameters (e.g., self-limiting behavior of first gas A, etc.).

In some embodiments, after the surface modification cycle, a transition cycle may be introduced to remove any unreacted quantities of first gas A present in ALE reactor 102. During the transition cycle, the flow of first gas A is terminated and its partial pressure is reduced as it is pumped out of the reactor. In some embodiments, the transition cycle can last from about 0.1 s to about 0.6 s (e.g., between about 0.1 s and 0.3 s). However, the transition cycle can be shorter or longer, and may depend on the reactor's geometry (e.g., reactor's volume, the distance of shower head 112 from wafer 120, etc.), the pumping speed of the pump stack (not shown in FIG. 1), or other process parameters. During the transition cycle, and referring to FIG. 5, bottom plate 116 is rotated counter clockwise back to its "closed position" so that flow of first gas A is prevented from flowing into ALE reactor 102.

In operation 606 and referring to FIG. 5, an atomic layer etching cycle is performed. According to some embodiments, the etching cycle can include releasing the second gas B by rotating (e.g., counter clockwise) bottom plate 116 of shower head 112 to align one or more second gas channels 302 B of top plate 114 with one or more gas channels 304 of the bottom plate 116. According some embodiments, the etching cycle can last from about 0.3 s to about 2 s. However, the etching cycle can be shorter or longer, and may depend on the reactor's geometry (e.g., reactor's volume, the distance of shower head 112 from wafer 120, etc.), the pumping speed of the pump stack (not shown in FIG. 1), or other process parameters. According to some embodiments, during the first 0.1 s to 0.3 s of the 2 s etching cycle, the flow of second gas B can increase (e.g., ramping up). For example, the flow of second gas B can increase from zero to a target value. In some embodiments, a plasma can be used to assist the etch process. For example, an RF electromagnetic field can be applied from an external RF power generator to wafer chuck 118 to strike a plasma from second gas B. According to some embodiments, the RF power applied to wafer chuck 118 can range from about 100 Watts to about 500 Watts. During the etch step, the process pressure can range from about 20 mTorr to about 50 mTorr. By way of example and not limitation, second gas B can be a mixture of a perfluorocarbon gas, oxygen, and argon. The oxygen and perfluorocarbon gas flow rate can range from about 5 sccm to about 30 sccm, and the argon flow rate can range from about 200 sccm to about 1000 sccm. By way of example and not limitation, perfluorocarbon gases that can be used include tetrafluoromethane ($CF_4$), octafluorocyclobutane ($C_4F_8$), hexafluoro-2-butyne ($C_4F_6$), etc. In some embodiments, method 600 may be repeated multiple times until the desired amount of material from features or structures on wafer 120 is removed.

Figure 7:
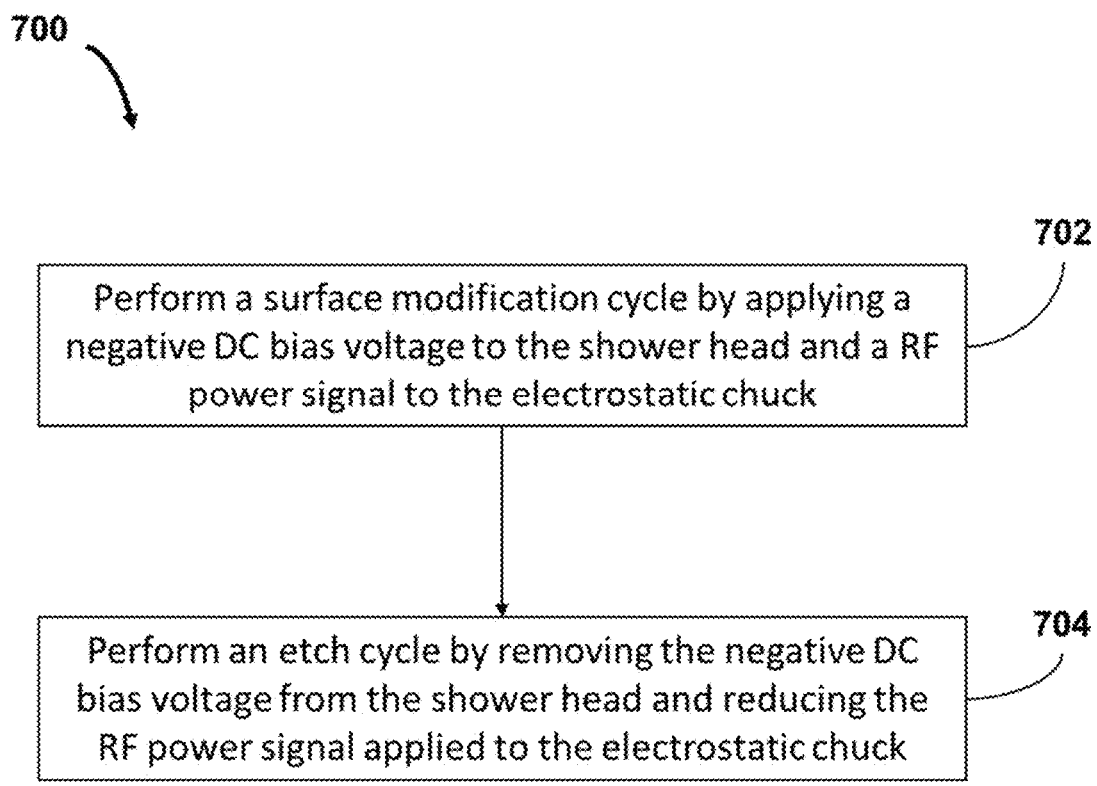

FIG. 7 is a flowchart for an exemplary method 700 that describes an etching process using a reactor having a shower head and a wafer chuck. Other operations may be performed between the various operations of exemplary method 700 and may be omitted merely for clarity. Therefore, the exemplary method 700 may not be limited to the operations described below.

Method 700 may be performed in ALE reactor 102 of ALE system 100 shown in FIG. 1. According to some embodiments, reactor 102 includes (i) an exemplary shower head with top plate 114 and a bottom plate 116 configured to receive a negative DC bias voltage, (ii) and wafer chuck 118 configured to receive an RF power signal. Further, referring to FIG. 1, shower head 112 can be electrically connected to an external power supply (not shown in FIG. 1), such as an RF generator or a DC power supply that may keep shower head 112 at a negative bias voltage. In some embodiments, the RF power signal applied to shower head 112 can range from about 10 Watts to about 2700 Watts, and an absolute value of the negative DC bias voltage can range from 0 to about 900 Volts (e.g., 450V to 500V). In addition, shower head 112 can include top plate 114 and bottom plate 116. According to some embodiments, bottom plate 116 can rotate clockwise or counter clockwise around an axis perpendicular to its center of mass with the help of a stepping motor or other suitable mechanism.

Method 700 begins with operation 702, where a surface modification cycle is performed by applying a negative DC bias voltage to shower head 112 and an RE power signal to wafer chuck 118. For example purposes, the signal applied to shower head 112 in method 700 will be described in the context negative DC bias voltage. Based on the disclosure herein, an RF signal (as discussed above) can be used instead of a negative DC bias voltage and is within the spirit and scope of this disclosure. In some embodiments, the RF power signal applied to shower head 112 can range from about 10 Watts to about 2700 Watts, and an absolute value of the negative DC bias voltage can range between 0V and about 500V.

Figure 8:
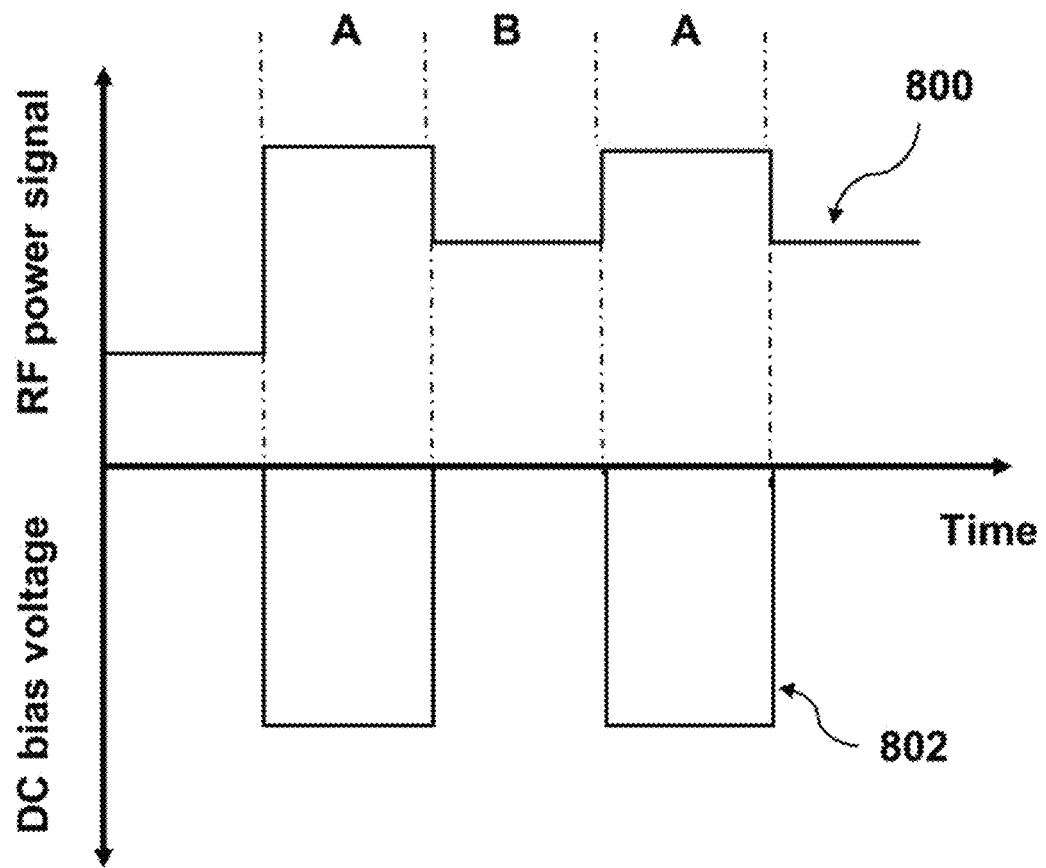
FIG. 8 is a graphical representation of exemplary waveforms for a radio frequency (RF) power signal and a negative DC bias voltage in an atomic layer etch (ALE) process, according to some embodiments.

FIG. 8 is a graphical representation of exemplary waveforms for an RF power signal 800 (applied to wafer chuck 118) and a negative DC bias voltage 802 (applied to shower head 112), according to some embodiments. In FIG. 8, RF power signal 800 and negative DC bias voltage 802 are plotted on a common time axis. Operation 702 of method 700 can be described in the context of FIG. 8 by surface modification cycle A, where a negative DC bias is applied to shower head 112, and an RE power signal is applied to wafer 120 through wafer chuck 118 shown in FIG. 1.

In order for the plasma to strike, ALE reactor 102 is filled with a gas at a pressure between, for example, about 20 mTorr and about 50 mTorr. In some embodiments, the gas can be a mixture of a perfluorocarbon, oxygen, and argon. The oxygen and perfluorocarbon flow rate can range from about 5 sccm to about 30 sccm, and the argon flow rate can range from about 200 sccm to about 1000 sccm. By way of example and not limitation, perfluorocarbons that can be used include tetrafluoromethane ($CF_4$), octafluorocyclobutane ($C_4F_8$), hexafluoro-2-butyne ($C_4F_6$), and the like. Gases can be released through shower head 112 by rotating bottom plate 116 or top plate 114, according to some embodiments.

The plasma ions, which are accelerated towards bottom plate 116 by an electric field formed between shower head 112 and wafer 120, can react with a material on bottom plate 116 to form free radicals. The free radicals can be subsequently accelerated towards wafer 120, where a modification reaction can take place between the free radicals and the exposed material(s) on the surface of wafer 120. As a result, a reactive surface layer can be formed. Since the modification reaction can be quasi self-limiting, the reactive surface layer can have a finite thickness. In some embodiments, the finite thickness of the reactive surface layer may depend, for example, on the gas chemistry, the type of exposed material on wafer 120 (e.g., nitride, oxide, metal, etc.), and the plasma parameters. The reactive surface layer can be removed during a subsequent removal, or etch, cycle. Any material not exposed to the radicals will not be removed. The reactive surface layer can include a gradient in chemical composition and/or physical structure. The amount of radicals generated through the process described above can be controlled through the process parameters, such as plasma density, magnitudes of RF power signal 800 and negative DC bias voltage 802, a process pressure, etc.

The free radical generation, as described above, requires plasma ion interaction with a material on bottom plate 116 (target material). In some embodiments, bottom plate 116 can be made of a material, coated with a material, or retrofitted with an external plate, e.g., external plate 122, made of a material that can produce free radicals when in contact with the plasma ions. By way of example and not limitation, the material may include a metal such as platinum (Pt), iridium (Ir), ruthenium (Ru), rhenium (Re), gold (Au), palladium (Pd), and silver (Ag), copper (Cu), aluminum (Al), nickel (Ni), titanium (Ti), tungsten (W), zinc (Zn), indium (In), tin (Sn), vanadium (V), zirconium (Zr), chromium (Cr), cobalt (Co), yttrium (Y), niobium (Nb), tantalum (Ta), molybdenum (Mo), iron (Fe), lead (Pb), or beryllium (Be), and indium (In); or semiconductors, such as silicon (Si). In some embodiment, the target material can be an oxide such as tantalum oxide ($Ta_2O_5$), niobium oxide ($Nb_2O_5$), hafnium oxide ($Hf_2O_5$), silicon oxide ($SiO_2$) titanium oxide ($TiO_2$), zirconium oxide ($ZrO_2$), aluminum oxide ($Al_2O_3$); a composite oxide, such as strontium-titanium oxide ($SrTiO_3$), strontium-ruthenium oxide ($SrRuO_3$), palladium-titanium oxide ($PdTiO_3$), strontium-beryllium-tantalum oxide ($SrBi_2Ta_2O_9$), titanium oxide ($TiO_3$), lithium-niobium oxide ($LiNbO_3$), lead-zirconium-titanium oxide ($Pb(Zr,Ti)O_3$), and strontium-beryllium-tantalum-niobium oxide ($SrBi_2(Ta,Nb)_2O_9$). In some embodiments, the target material can be a metal alloy, a ferroelectric material, a dielectric, or a compound oxide.

In operation 704 of method 700, and referring to FIG. 8, an etching cycle B is performed by removing (e.g., turning off) negative DC bias voltage 802 applied to shower head 112 and reducing RF power signal 800 applied to wafer chuck 118. In some embodiments, RF power signal 800 can be reduced by about 50 Watts to 100 Watts. For example, if during surface modification cycle A, negative DC bias voltage 802 is at 500V and RF power signal 800 is at 300 Watts, during etching cycle B, negative DC bias voltage 802 can be at 0V and RF power signal 800 can be reduced from 300 Watts to a value between 200 Watts and 250 Watts.

During etching cycle B, the plasma can be sustained but the free radical generation is suppressed or eliminated. With the free radical generation suppressed or eliminated, the plasma ions can etch the reactive surface layers on wafer 120. In some embodiments, the synchronized application of negative DC bias voltage 802 and RF power signal 800 can accelerate the switching between surface modification cycle A and etching cycle B. In some embodiments, surface modification cycle A and etching cycle B can succeed one another without a pump down (e.g., transition step). In some embodiments, surface modification cycle A and etching cycle B can be repeated until the targeted material is removed from the surface of wafer 120. The amount of ions generated through the process described above can be controlled through process parameters, such as for plasma density, RF power signal 800, process pressure, etc.

The present disclosure is directed to an exemplary ALE process in an ALE reactor that includes a shower head configured to receive a negative DC bias voltage and an electrostatic chuck configured to receive a RF power. The shower head includes a top plate and a bottom plate with one or more gas channels that receive incoming gases. In some embodiments, a gas can be released into the ALE reactor through openings when the rotation of the bottom plate allows corresponding gas channels from both plates to align. Depending on the rotation direction (e.g., clockwise or counter clockwise), the channels on the top and bottom plates can be aligned or misaligned, and a gas can therefore be released or restricted from flowing into the ALE reactor. In some embodiments, the bottom plate can be made of a material, coated with a material, or retrofitted with an external plate made of a material that can produce free radicals when is exposed to plasma ions. According to some embodiments, the ALE process can control an ion/radical ratio during a modification cycle, a transition cycle, and an etching cycle and reduce a switching time between the modification cycle and the transition cycle, a switching time between the transition cycle and the etching cycle, or a switching time between the modification cycle and the etching cycle.

In some embodiments, a method includes: (i) filling a first gas channel and a second gas channel in the top plate of the shower head with a first gas and a second gas, respectively, (ii) performing a first processing cycle is, where the first processing cycle includes rotating the top plate or the bottom plate to a first position to allow the first gas to flow through the shower head via the first gas channel and to restrict the second gas from flowing through the shower head via the second gas channel, and (iii) performing a second processing cycle that includes rotating the top plate or the bottom plate to a second position to allow the second gas to flow through the shower head via the second gas channel and to restrict the first gas from flowing through the shower head via the first gas channel.

In some embodiments, a method includes (i) rotating a top plate or a bottom plate of the shower head to a first position to allow a gas to flow through the shower head; (ii) performing a surface modification cycle that includes: applying a negative direct current (DC) bias voltage to the shower head, applying a radio frequency (RF) power signal to the wafer chuck; and (iii) performing an etching cycle that includes: removing the negative DC bias voltage from the shower head and lowering the RF power signal applied to the wafer chuck.

In some embodiments, a structure includes (i) a switch box configured to receive one or more gases; (ii) a shower head with a top plate with one or more first gas channels, and a bottom plate with one or more second gas channels, where the top plate is configured to receive the one or more gases from the switch box, and the bottom plate is configured to rotate to align the one or more second gas channels with the one or more first gas channels; and (iii) a wafer chuck configured to hold a wafer that receives the one or more gases from the shower head.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
    a switch box configured to receive a first gas and a second gas from respective gas boxes;
    a shower head with a top plate comprising first gas channels and second gas channels and a bottom plate comprising third gas channels, wherein the top plate is configured to receive and store the first and second gases from the switch box through respective gas lines, and the bottom plate is configured to release the first gas and block the second gas when the third gas channels are aligned with the first gas channels and to release the second gas and block the first gas when the third gas channels are aligned with the second gas channels; and
    a wafer chuck configured to hold a wafer that receives the first and second gases from the shower head.

2. The system of claim 1, wherein the shower head is configured to release the first gas in response to a rotation of the bottom plate such that the first gas channels of the top plate are aligned with the third gas channels of the bottom plate.

3. The system of claim 1, wherein the bottom plate is made of a material that produces free radicals in response to exposure to a plasma.

4. The system of claim 3, wherein the material comprises one or more of a metal, an oxide, a composite oxide, an alloy, and combinations thereof.

5. The system of claim 1, further comprising an external plate made of a material that produces free radicals in response to exposure to a plasma.

6. The system of claim 1, wherein the shower head is configured to receive a radio frequency (RF) power signal from an external power source that ranges from about 10 Watts to about 2700 Watts.

7. A system, comprising:
    an etch reactor configured to receive a first gas and a second gas from an external gas box, wherein the etch reactor comprises:
        a shower head with a top portion and a rotatable bottom portion, wherein the top portion comprises first gas channels and second gas channels configured to respectively receive and store the first and second gases from the external gas box, and the bottom portion comprises third gas channels configured to release the first gas and block the second gas when the third gas channels are aligned with the first gas channels and to release the second gas and block the first gas when the third gas channels are aligned with the second gas channels; and
        an electrostatic chuck configured to hold a wafer and apply a radio frequency (RF) power signal to the wafer; and
    an external RF power supply electrically coupled to the electrostatic chuck.

8. The system of claim 7, wherein the shower head is configured to receive an RF power signal or a direct current signal to generate a plasma from one or more of the first and second gases.

9. The system of claim 7, wherein the shower head comprises a material that can generate free radicals when exposed to a plasma from one or more of the first and second gases.

10. The system of claim 9, wherein the material comprises one or more of a metal, a metal alloy, an oxide, a ferroelectric, a dielectric, a compound oxide, a composite material, a semiconductor, and combinations thereof.

11. The system of claim 10, wherein the oxide comprises one or more of tantalum oxide ($Ta_2O_5$), niobium oxide ($Nb_2O_5$), hafnium oxide ($Hf_2O_5$), silicon oxide ($SiO_2$), titanium oxide ($TiO_2$), zirconium oxide ($ZrO_2$), or aluminum oxide ($Al_2O_3$), and combinations thereof.

12. The system of claim 7, wherein the bottom portion can be rotated clockwise or counter clockwise.

13. The system of claim 7, further comprising an external plate configured to generate free radicals when exposed to a plasma from one or more of the first and second gases.

14. A shower head, comprising:
 a first circular plate comprising first gas channels and second gas channels configured to respectively receive and store a first gas and a second gas; and
 a second circular plate rotatable around a common axis of rotation with the first circular plate and comprising third gas channels coupled to gas outlets on a bottom surface of the second circular plate, wherein the second circular plate is configured to release the first gas and block the second gas when the third gas channels are aligned with the first gas channels and to release the second gas and block the first gas when the third gas channels are aligned with the second gas channels.

15. The shower head of claim 14, wherein the first and second circular plates rotate independently from one another in a clockwise or counter clockwise motion.

16. The shower head of claim 14, wherein the second circular plate is configured to release the first or second gas through the gas outlets.

17. The shower head of claim 14, wherein the second circular plate comprises a material configured to generate radicals when exposed to a plasma from one or more of the first and second gases.

18. The shower head of claim 14, wherein the first circular plate is configured to receive the first and second gases from an external source.

19. The system of claim 1, wherein the first gas channels are configured to store the first gas in response to a rotation of the bottom plate such that the first gas channels of the top plate are misaligned with the third gas channels of the bottom plate.

20. The shower head of claim 14, wherein the first gas channels are configured to store the first gas and the second gas channels are configured to release the second gas in response to a rotation of the first and second circular plates such that the first gas channels are misaligned with the third gas channels and the second gas channels are aligned with one or more of the third gas channels.

* * * * *